United States Patent [19]

Otao et al.

[11] 4,146,847
[45] Mar. 27, 1979

[54] POWER LIMITING CIRCUITRY FOR USE WITH POWER AMPLIFIER

[75] Inventors: Kazumasa Otao; Kaku Sakaida, both of Tokyo, Japan

[73] Assignee: Trio Kabushiki Kaisha, Tokyo, Japan

[21] Appl. No.: 846,313

[22] Filed: Oct. 28, 1977

[30] Foreign Application Priority Data

Nov. 5, 1976 [JP] Japan .............................. 51-148788[U]
Nov. 10, 1976 [JP] Japan .............................. 51-150734[U]
Dec. 6, 1976 [JP] Japan .............................. 51-163188[U]

[51] Int. Cl.² .............................................. H03F 3/04
[52] U.S. Cl. .................................... 330/297; 330/143; 330/207 P; 330/298
[58] Field of Search ............ 325/362; 330/143, 207 P, 330/298; 361/100, 101, 103, 106

[56] References Cited

U.S. PATENT DOCUMENTS

3,814,988   6/1974   Ito ................................ 330/207 P X
3,912,981   10/1975   Tsurushima .................... 330/207 P X

*Primary Examiner*—Lawrence J. Dahl
*Attorney, Agent, or Firm*—Gerald J. Ferguson, Jr.; Joseph J. Baker

[57] ABSTRACT

Power limiting circuitry for use with a power amplifier, the power amplifier having (a) a power supply voltage source connected thereto and (b) a load impedance, the power limiting circuitry comprising detecting means for detecting the magnitude of the load impedance; and control means responsive to the detecting means for controlling the magnitude of the power supply voltage applied to the power amplifier; means for sensing the temperature at a predetermined point in the power amplifier and generating an output signal when the temperature exceeds a predetermined amount; and AND circuit means responsive to the detecting means and the temperature sensing means for actuating the control means in response thereto.

12 Claims, 11 Drawing Figures

POWER LIMITING CIRCUITRY FOR USE WITH POWER AMPLIFIER

BACKGROUND OF THE INVENTION

This invention relates to a power limiter circuit that limits power supply voltage according to the value of the load resistance of transistor power amplifier.

The output of a transistor power amplifier with class B operation primarily varies with the load resistance value. Since the majority of speakers used today are 8 Ω and 4 Ω, a large difference occurs in the power output of a transistor power amplifier depending on whether the loading is an 8 Ω or a 4 Ω speaker. If the power outputs resulting from 8 Ω speaker loading and 4 Ω speaker loading could be made the same, it would not only enhance amplifier thermal design and protect power transistors from excessive current flow but also an economical amplifier would result.

Further, although it is known to control the input of a transistor amplifier by sensing load current, circuitry for effecting this has a shortcoming in that waveform distortion or abnormal sounds occur due to the phase difference between voltage and current since the actual speaker is not purely resistive.

SUMMARY OF THE INVENTION

A primary object is to provide an improved power limiter circuit which controls the power supply voltage supplied to a power amplifier by sensing the load resistance to suppress excessive power output and enhance thermal design of the power amplifier.

This object can illustratively be achieved, according to this invention, by providing a bridge circuit which includes the load resistance of the power amplifier as one arm and which senses the load resistance value; and a control circuit responsive to the sensed load resistance which controls the power supply voltage for the amplifier according to the sensed load resistance value.

Other objects and advantages of this invention will be apparent from a reading of the following specification and claims taken with the drawing.

DETAILED DESCRIPTION OF PREFERRED EMBODIMENTS

Figure 1:
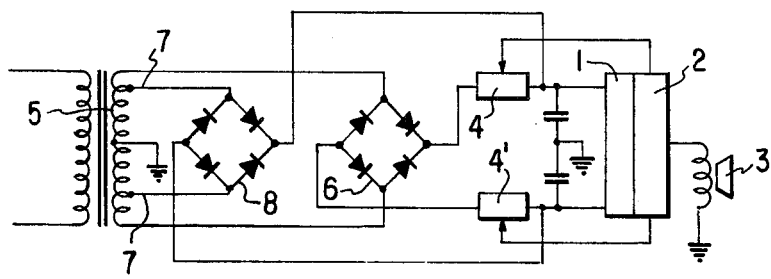
FIG. 1 is a block diagram of an illustrative embodiment of this invention.

Like reference numerals refer to like components in all figures of the drawing.

Referring to FIG. 1, there is shown a transistor power amplifier 1, and a detector 2 that detects or senses the size of a load resistance 3 of amplifier 1. The output of detector 2 controls controllers 4 and 4'. When the load resistance is large (for example, in the case of an 8 Ω speaker), the controllers 4 and 4' allow the total output voltage of a power supply transformer 5 to be employed as the supply voltage through a bridge rectifier circuit 6. When the load resistance value is small (for example, in the case of a 4 Ω speaker), controllers 4 and 4' are switched to the voltage of intermediate taps 7 of power supply transformer 5 which is then employed as the supply voltage for amplifier 1 through a bridge rectifier circuit 8. Thus, regardless of the size of load resistance 3, the maximum output of the amplifier remains the same. In other words, automatic switching is effected to prevent an excessive output in the case of a small load.

Figure 2:
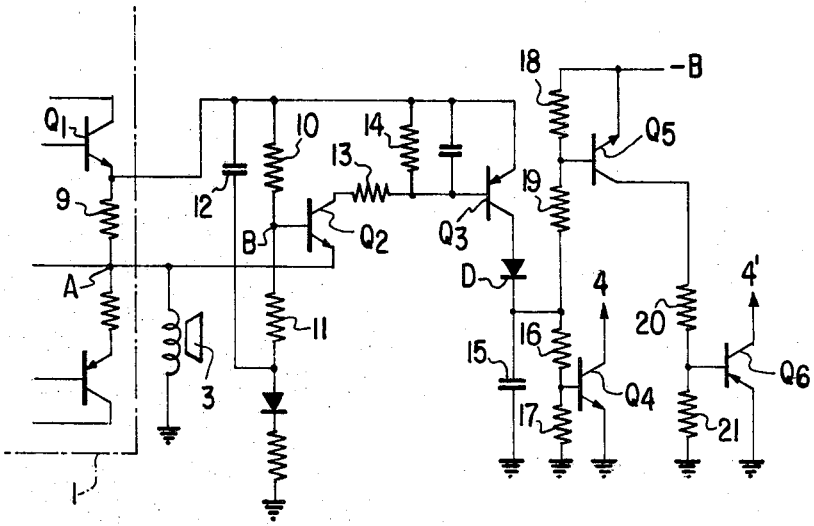
FIG. 2 is a circuit diagram of an illustrative detector for use in the block diagram of FIG. 1.

FIG. 2 is an illustrative circuit diagram of detector 2 of FIG. 1. A bridge circuit is composed of an emitter resistor 9 of an output transistor $Q_1$ of amplifier 1, load resistance 3, and resistors 10 and 11 connected between the emitter of transistor $Q_1$ and ground as respective arms. The resistors 10 and 11 are shunted by a capacitor 12, thus eliminating the effects of improper phasing between the current flowing to the load and the load voltage. The emitter and base of transistor $Q_2$ are connected between (a) connection point A of emitter resistor 9 and load resistance 3 and (b) connection point B of resistors 10 and 11. The collector of transistor $Q_2$ is connected to the emitter of transistor $Q_1$ via a series circuit of collector resistors 13 and 14.

On the other hand, the base emitter of transistor $Q_3$ are connected such that the voltage of collector resistor 14 of transistor $Q_2$ is applied between them, and the collector of transistor $Q_3$ is grounded via the series circuit of diode D and capacitor 15. Resistors 16 and 7 are conected so as to divide the charged voltage of capacitor 15 between these resistors. At the same time, a series circuit of resistors 18 and 19 is further connected in series to the series circuit of resistors 16 and 17, and one end of resistor 18 is connected to the power supply -B. The base and emitter of transistor $Q_4$ is connected such that the voltage at resistor 17 is applied between them, and the collector of transistor $Q_4$ is connected to controller 4. The base and emitter of transistor $Q_5$ are connected such that the voltage at resistor 18 is applied between them, and the collector of transistor $Q_5$ is grounded via the series circuit of resistors 20 and 21. The base and emitter of transistor $Q_6$ are connected such that the voltage of resistor 21 is applied between them and the collector of transistor $Q_6$ is connected to controller 4'.

Figure 3A:
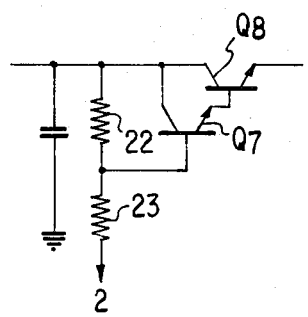
FIGS. 3a and 3b are circuit diagrams of illustrative controllers for use in the block diagram of FIG. 1.
Figure 3B:
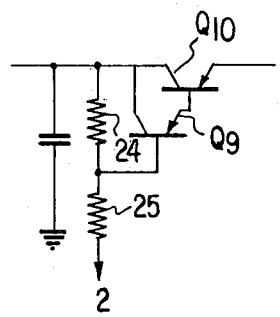

Illustrative circuit diagrams of controllers are shown in FIGS. 3a and 3b. FIG. 3a illustrates the circuit diagram of controller 4 and FIG. 3b that of controller 4'. As shown in FIG. 3a, the series circuit of resistors 22 and 23 is connected from the positive side of the power supply and connected to the collector of transistor $Q_4$ of detector 2, the connection being such that the voltage at resistor 22 is applied between the base and collector of transistor $Q_7$. The emitter of transistor $Q_8$ is joined by a Darlington connection to transistor $Q_7$ and is used as the positive supply for amplifier 1. On the other hand, the series circuit of resistors 24 and 25 is connected from the negative side of the power supply as shown in FIG. 3b and connected to the collector of transistor $Q_6$ of the detector 2, the connection being such that the voltage at resistor 24 is applied between the base and collector of transistor $Q_9$. The emitter of transistor $Q_{10}$, joined by a Darlington connection to transistor $Q_9$, is used as the negative power supply for amplifier 1.

In operation, when an 8 Ω speaker is connected as the load resistance 3, resistors 10 and 11 are so selected that the bridge circuit comprised of emitter resistor 9, 8 Ω speaker 3, and resistors 10 and 11, is balanced. Transistors $Q_2$, $Q_3$, $Q_4$, $Q_5$, and $Q_6$ are thus non-conducting, while transistors $Q_7$, $Q_8$, $Q_9$, and $Q_{10}$ are conducting. No current flows to diode bridge 8, rather current flows only to diode bridge 6. Thus, the total voltage of power supply transformer 5 is rectified by diode bridge 6 and supplied as the power supply voltage to amplifier 1.

When a 4 Ω speaker is connected as the load, the bridge becomes unbalanced and transistor $Q_2$ becomes conductive due to the unbalanced voltage produced between A and B. Transistor $Q_3$ then also conducts. Consequently, capacitor 15 is charged with a plus-voltage. This charged voltage is divded by resistors 16 and 17, and transistor $Q_4$ conducts. Concurrently, transistors $Q_5$ and $Q_6$ become conductive to control the base voltages of transistors $Q_7$ and $Q_9$ and transistors $Q_7$, $Q_8$, and $Q_9$, $Q_{10}$ become non-conductive. The current at diode bridge 6 is thus cut off, the tap of transformer 5 is switched, and the voltage at taps 7 of transformer 5 is rectified by diode bridge 8 and supplied to amplifier 1 as the power supply voltage. This condition is maintained for a certain time determined by the time constant of the voltage charged by capacitor 15 to be discharged through resistors 16 and 17.

Figure 4:
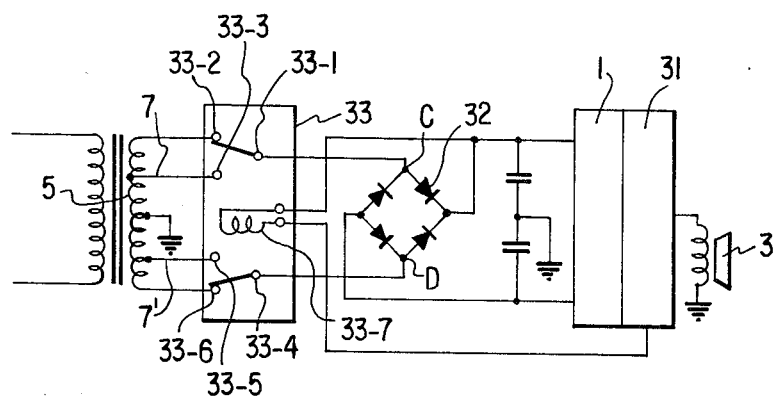
FIG. 4 is a block diagram of another illustrative embodiment of this invention.

FIG. 4 is a block diagram of another illustrative embodiment of this invention. As shown in FIG. 4, 1 is a transistor power amplifier, and 31 denotes the detector that detects the size of load resistance 3 of amplifier 1.

The output of detector 31 controls relay 33. When the load resistance value is large (for example, in the case of an 8 Ω speaker), relay 33 is non-energized and relay contact point 33-2 is connected to the common relay contact point 33-1 and relay contact point 33-6 to the common relay contact point 33-4. Thus, the total voltage of transformer 5 is used as the supply voltage to amplifier 1 via bridge rectifier circuit 32. When the load resistance value is small (for example, in the case of a 4 Ω speaker), the output of detector relay 33 is energized by the output of detector 31 and relay contact point 33-3 is connected to common relay contact point 33-1, and relay contact point 33-5 to common relay contact point 33-4. Thus, the tap voltage of transformer 5 is used for the supply voltage to amplifier 1 by way of bridge rectifier circuit 32, resulting in the same maximum output of the amplifier regardless of the size of load resistance 3. In other words, automatic switching is effected to prevent excessive output in the case of a low load value.

Figure 5:
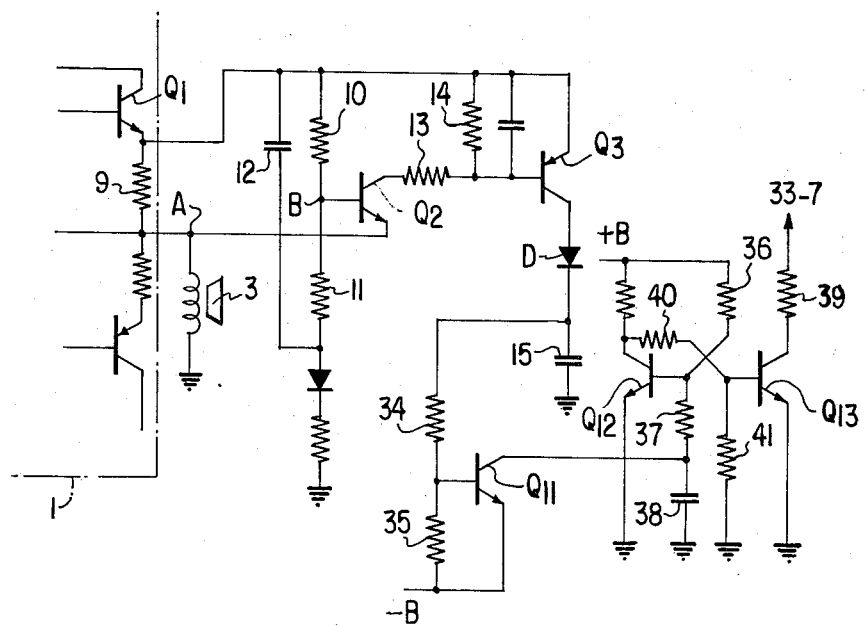
FIG. 5 is a circuit diagram of an illustrative detector for use in the block diagram of FIG. 4.

FIG. 5 is an illustrative circuit diagram of detector 31. The emitter resistor 9 of output transistor $Q_1$ of amplifier 1, load resistance 3, resistors 10 and 11 connected between the emitter of transistor $Q_1$ and ground constitute a bridge circuit. Resistors 10 and 11 are shunted by capacitor 12 thus eliminating the effects of improper phasing between the current flowing to the load and load voltage. The emitter and base of transistor $Q_2$ are connected between connection point A of emitter resistor 9 and load resistance 3 of the bridge circuit and connection point B of resistors 10 and 11. The collector of transistor $Q_2$ is connected to the emitter of transistor $Q_1$ via the series circuit of collector resistors 13 and 14. Meanwhile, the base and emitter of transistor $Q_3$ are so connected that the voltage of collector resistor 14 of transistor $Q_2$ is applied thereacross and the collector of transistor $Q_2$ is grounded via a diode and capacitor 15. The terminals of the diode and capacitor 15 are connected to the power supply −B via the series circuit of resistors 34 and 35. The base and emitter of transistor $Q_{11}$ are so connected that the voltage at resistor 35 is applied thereacross.

Transistors $Q_{12}$ and $Q_{13}$ constitute a monostable multivibrator and the power supply +B is grounded by way of the series circuit of resistors 36 and 37 and capacitor 38. The terminals of resistors 36 and 37 are connected to the base of transistor $Q_{12}$ on the stable side of the monostable multivibrator. Resistor 37 and capacitor 38 are so connected that the connected point is triggered from the collector of transistor $Q_{11}$. The collector potential of transistor $Q_{12}$ is grounded via the series circuit of resistors 40 and 41, and the connecting points of resistors 40 and 41 are connected to the base of transistor $Q_{13}$. The collector of transistor $Q_{13}$ is connected to one end of the excitation coil 33-7 of relay 33 by way of collector resistor 39.

Referring to FIG. 4, relay 33 comprises a controller consisting of a two pole, double throw relay switch. The other end of excitation coil 37 of relay 33 is connected to the positive side of the DC power supply rectified by bridge rectifier circuit 32; the common contact points 33-1 and 33-4 of the relay are connected to the power supply connecting points C and D of bridge rectifier circuit 32; and the normally closed contact points 33-2 and 33-6 of the relay are connected to the total voltage terminal of transformer 5 and the normally open contact points 33-3 and 33-5 to the intermediate taps 7 and 7' of transformer 5.

In operation, when an 8 Ω speaker is connected as load resistance 3, resistors 10 and 11 are so selected that the bridge circuit comprising emitter resistor 9, the 8 Ω speaker and resistors 10 and 11 is balanced. Transistors $Q_2$ and $Q_3$ are thus non-conductive. When transistor $Q_3$ is not conducting, the monostable multivibrator based on transistors $Q_{12}$ and $Q_{13}$ does not operate, and relay 33 remains non-energized. The total voltage of transformer 5 is rectified by bridge rectifier circuit 32 and added to amplifier 1 by way of relay contact point 33-2 and the common contact point 33-1, and relay contact point 33-6 and common contact point 33-4.

When a 4 Ω speaker is connected as load resistance 3, the bridge circuit becomes unbalanced, and transistors $Q_2$ and $Q_3$ become conductive due to the unbalanced voltage produced between A and B, thus producing a voltage at capacitor 15. This causes transistor $Q_{11}$ to conduct and −B voltage is to capacitor 38 causing transistor $Q_{12}$ to become non-conductive. Transistor $Q_{13}$ becomes conductive for a time determined by resistors 36 and 37 and capacitor 38, relay 33 is energized, and the voltage of transformer 5 is switched to the tap voltage, which after being rectified by bridge rectifier circuit 32, is supplied to amplifier 1 as the power supply.

As explained above, according to this invention, even when the resistance value of the speaker changes, the output of the speaker is maintained within a fixed range by switching the tap of the power supply transformer with the resistance value of the speaker. Thus, when a speaker of low resistance is used, excessive output is not produced, resulting in an advantageous thermal design of the amplifier. In addition, the heat sink and transformer can be small, which reduces the size and weight of the amplifier.

Figure 6:
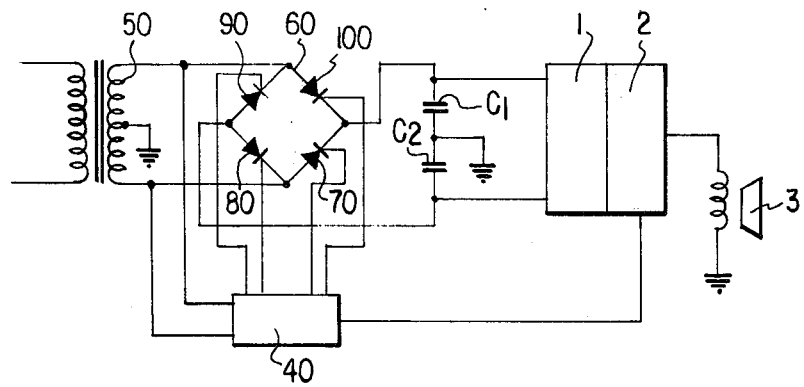
FIG. 6 is a block diagram of another illustrative embodiment of this invention.

FIG. 6 is a block diagram of another embodiment of the invention where 1 is a transistor amplifier such as a transistor single-ended push-pull amplifier and 2 is a detector for detecting the size of the load resistance 3 of the transistor amplifier. The output of detector 2 controls a control circuit 40. Control circuit 40 controls a bridge rectifier circuit 60 that comprises a rectifier circuit. The bridge circuit 60 is connected as an ordinary full-wave bridge rectifier circuit and consists of four silicon-controlled rectifiers 70–100.

In bridge rectifier circuit 60 which may be considered a part of control circuit 40, the AC terminal is connected between the two windings of power supply transformer 50 that are grounded by the center tap. The series circuit of capacitors $C_1$ and $C_2$ are connected to the DC terminals and the connecting point of capacitors $C_1$ and $C_2$ is grounded. The voltage of capacitors $C_1$ and $C_2$ is employed as the power supply voltage of amplifier 1.

Figure 7:
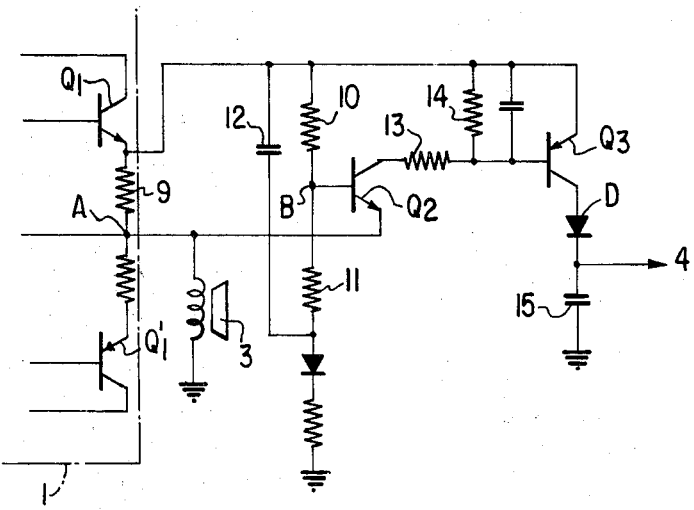
FIG. 7 is a circuit diagram of an illustrative detector circuit for use in the power limiter circuit of FIG. 6.

FIG. 7 is an illustrative circuit diagram of detector 2. The bridge circuit comprises emitter resistor 9 of power transistor $Q_1$ of transistor amplifier 1, load resistance 3 and resistors 10 and 11. Resistors 10 and 11 comprise the ratio arm between earth and the emitter of transistor $Q_1$ as respective arms. The series circuit of resistors 10 and 11 is shunted by capacitor 12, thus eliminating the effect of improper phasing between the current flowing to the load resistance 3 and the voltage added to the load resistance 3. The emitter and the base of transistor $Q_2$ are connected between the connection point A of emitter resistor 9 and load resistance 3 of the bridge circuit and the connection point B of resistors 10 and 11. The collector of transistor $Q_2$ is connected to the emitter of transistor $Q_1$ via the series circuit of resistors 13 and 14 that form the collector resistance.

On the other hand, the base and emitter of transistor $Q_3$ are so connected that the voltage of the collector resistor 14 of transistor $Q_2$ is applied thereto and the collector of transistor $Q_3$ is grounded via the series circuit of diode D and capacitor 15. A detector signal is outputted from the connection point of diode D and capacitor 15 and inputted to control circuit 40. The control circuit 40 consists of ordinary phase control circuitry.

In operation, when an 8 Ω speaker is connected as the load resistance 3, resistors 10 and 11 are selected so that the bridge circuit consisting of emitter resistor 9, the 8 Ω speaker and resistors 10 and 11 is balanced. Transistors $Q_2$ and $Q_3$ thus become non-conductive, and there is no signal from the connection point of diode D and capacitor 15 to control circuit 40. Control circuit 40 turns on silicon-controlled rectifiers 70–100 at every half cycle of the power supply frequency during the entire period. In other words, the silicon-controlled rectifiers 80 and 100 are conducting during the entire period of the positive half cycles of the power supply frequency and silicon-controlled rectifiers 70 and 90, during the entire period of the negative half cycles thus applying a voltage having full wave rectification of the AC power supply voltage to transistor amplifier 1.

When a 4 Ω speaker is connected as load resistance 3, the above bridge circuit becomes unbalanced. Transistor $Q_2$ thus becomes conductive due to the unbalanced voltage produced between A and B simultaneously causing transistor $Q_3$ to conduct. Therefore, capacitor 15 is charged with a positive voltage, and a detector signal of positive voltage is outputted to control circuit 40.

Control is effected by the signal from detector 2 which delays the turn-on time of the silicon-controlled rectifier by control circuit 40 to thereby decrease the mean value of the supply voltage for transistor amplifier 1. The maximum output of amplifier 1 is thus limited when a 4 Ω speaker is used as the load, the maximum output of amplifier 1 being the same as that with an 8 Ω speaker as the load. Each silicon-controlled rectifier is switched at every positive and negative half cycle of the power supply frequency as in the case when an 8 Ω speaker is connected.

Figure 8:
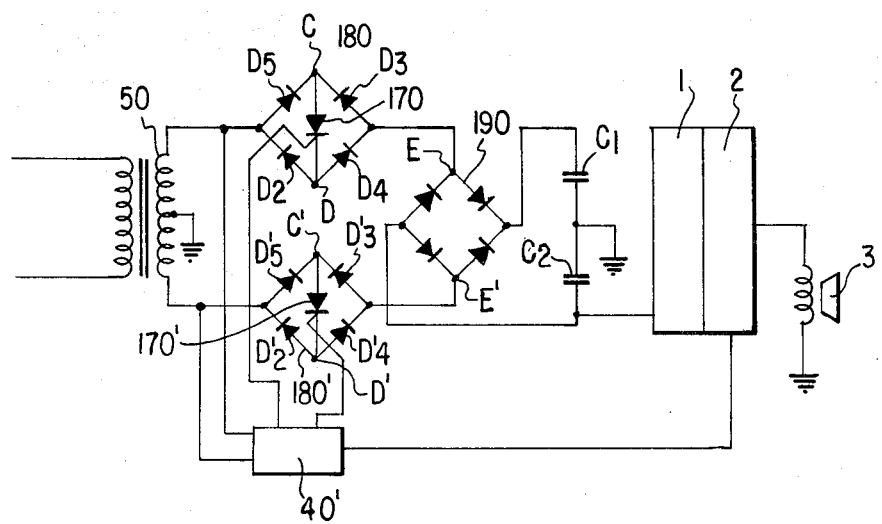
FIG. 8 is a block diagram of another illustrative embodiment of this invention.

FIG. 8 shows a circuit diagram of another illustrative embodiment of this invention where instead of a bridge rectifier circuit comprising silicon-controlled rectifiers to effect the control end of a control circuit, the circuitry of FIG. 8 utilizes a bridge rectifier circuit 190 comprised of diodes, a controlled circuit 180 consisting of diodes $D_2$–$D_5$ and silicon-controlled rectifier 170 and controlled circuit 180' consisting of silicon-controlled rectifier 170'.

The controlled circuits 180 and 180' are the terminal components of control circuit 40' and are built as follows. Controlled circuit 180 has the cathode of diode $D_2$ connected to the anode of diode $D_5$ as well as to one winding terminal of the power supply transformer 5 that is grounded by the center tap. The cathode of diode $D_5$ is connected to the cathode of diode $D_3$ as well as to the anode of a silicon-controlled rectifier 170. The anode of diode $D_3$ is connected to one end E of the AC side of the bridge rectifier circuit 190 as well as to the cathode of diode $D_4$ and the anode of diode $D_4$ is connected to the anode of diode $D_2$ as well as to the cathode of silicon-controlled rectifier 170.

The controlled circuit 180' is the same as controlled circuit 180 where the terminals of the cathode of diode $D_2'$ and the anode of diode $D_5'$ are connected to the other winding end of power supply transformer 5 and the terminals of the anode of diode $D_3'$ and the cathode of diode $D_4'$ are connected to the other end E' of the AC side of the bridge rectifier circuit 190.

The DC side of the bridge rectifier circuit 190 connects to capacitors $C_1$ and $C_2$ and is used as the power supply for transistor amplifier 1. Detector 2 and control circuit 40 are basically the same as detector 2 and control circuit 40 of FIG. 6. The control circuit 40' of FIG. 8 includes the controlled circuits 180 and 180' at its controlled parts whereas the control circuit 40 of FIG. 6 includes bridge rectifier circuit 60 at its controlled part where bridge rectifier circuit 60 combines a rectifying action.

In FIG. 8, the signal from detector 2 that detects the value of load resistance 3 of amplifier 1 controls control circuit 40', regulates the mean current to capacitors $C_1$ and $C_2$ by controlling the turn-on time of silicon-controlled rectifiers 170 and 170' by the outputs of control circuit 40', and controls the supply voltage for amplifier 1 so that the maximum output of an amplifier 1 having a 4 Ω speaker connected as load resistance 3 becomes the same as the maximum output when an 8 Ω speaker is connected as load resistance 3.

Figure 9:
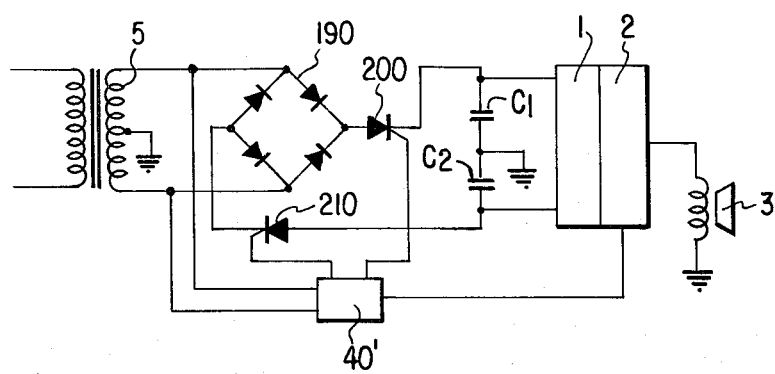
FIG. 9 is a block diagram of another illustrative embodiment of this invention.

A circuit diagram of another illustrative embodiment is shown in FIG. 9 where, in place of bridge rectifier circuit 60 of FIG. 6, the bridge rectifier circuit 190 is connected between the windings of power supply transformer 5 that ground the center tap and is also connected to the ungrounded terminals of capacitors $C_1$ and $C_2$ via silicon-controlled rectifiers 200 and 210 respectively connected in the forward direction to the DC terminals of bridge rectifier circuit 190. The silicon-controlled rectifiers 200 and 210 comprise the controlled parts of control circuit 40', which is controlled by the output signal of detector 2, the gates of rectifiers 200 and 210 being controlled by the outputs of control circuit 40'. The charged voltage of capacitors $C_1$ and $C_2$ is used as the power supply for transistor amplifier 1. The circuit for detector 2 is the same as in FIG. 6.

In operation the circuitry of FIG. 9 detects the value of load resistance 3 of transistor amplifier 1 to control the output of the control circuit 40', regulate the turn-on time of silicon-controlled rectifiers 200 and 210 with the output of control circuit 40' to adjust the mean current to capacitors $C_1$ and $C_2$, and to control the supply voltage value to transistor amplifier 1 so that the maximum output of transistor amplifier 1 when connected to a 4 Ω speaker is equal to the maximum output of transistor amplifier 1 when connected to an 8 Ω speaker.

As explained above, according to this invention, an amplifier with an advantageous thermal design as well as economical one can be effected by regulating the maximum output of the amplifier within a set range by reducing the power supply voltage of the amplifier when the resistance value of the speaker is low. In addition, the effects of improper phasing between the current flowing to the speaker and the voltage applied thereto can be eliminated by connecting a capacitor in parallel to the ratio arm of a bridge circuit that includes a load resistance as one arm so that the development of waveform distortion and abnormal sounds can be prevented.

In the above circuit of FIGS. 1–9, the power supply voltage of power amplifier 1 is changed according to the load resistance value and the output of the power amplifier is limited within a fixed range so that excessive output is not produced by automatically switching the power supply voltage. However, when amplifying signals have a small time ratio for large outputs such as music signals, the mean loss of the power transistor is small, and the temperature of the power transistors does not rise too much. Thus, the circuits of FIGS. 1–9 in these instances may have a shortcoming in that the output of the amplifier is limited within a fixed range, when amplifying music signals, the limiting being based only on the load resistance value.

Figure 10:
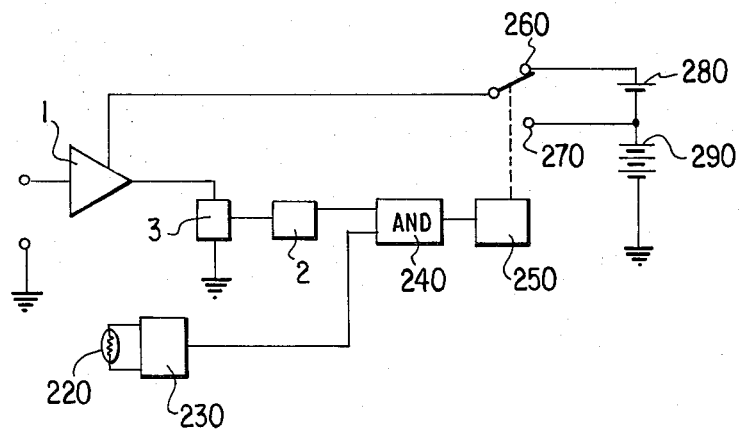
FIG. 10 is a block diagram of another illustrative embodiment of this invention.

FIG. 10 is a block diagram of an illustrative further embodiment of this invention where the foregoing shortcoming is avoided. In FIG. 10, 1 denotes transistor power amplifier 1. Load resistance 3 is connected to the transistor power amplifier. A first detector 2 for detecting the resistance value of load resistance 3 is connected to amplifier 1 and load resistance 3 where the detector may correspond to that shown in FIG. 7 where the output is taken from capacitor 15. A thermistor 220 is mounted on the heat sink of the power transistor of amplifier 1. A second detector circuit 230 that includes thermistor 220 detects the temperature of the power transistor.

The first detector circuit 2 for detecting load resistance value and second detector circuit 230 for detecting the temperature of the power transistor are so connected that their outputs are inputted into an AND circuit 240. The AND circuit 240 is connected so that its output drives control circuit 250. The switching contact point 260 of switching circuit 250 is connected to one terminal of power supply 280 which is connected in series with power supply 290. Switching contact point 270 is connected to the connection point of power supply 290 and power supply 280. The first detector circuit 2 for load resistance value determination may be the same circuit as shown in FIG. 7 and second detector circuit 230 and control circuit 250 are composed of circuits that are conventionally used where circuit 250 may be, for example, a relay or any of the control arrangements disclosed in FIGS. 1–9.

In the circuit of FIG. 10, first detector circuit 2 typically produces an output when the value of load resistance 3 is below the set value causing an unbalancing of the bridge circuit that includes load resistance 3 although it may also produce an output when the value of resistance 3 is the set value. Second detector 230 produces an output when the temperature of the transistor exceeds a fixed value. The AND circuit 240 produces an output only when the outputs from the first detector circuit and the second detector circuit are present concurrently. It drives switching circuit 250 and switching contact point is switched from contact point 260 to 270 and power supply 290 is applied to amplifier 1 as the power supply voltage for transistor power amplifier 1. When either the first detector circuit 2 or the second detector circuit 230 does not produce an output, the AND circuit 240 does not produce an output and the switching contact point is connected to contact point 260. Thus, the voltage sum of power supplies 280 and 290 is supplied as the power supply voltage of transistor power amplifier 1.

As explained above, according to this invention, the power supply voltage changes only when the output of the first detector circuit that detects the load resistance value and the output of the second detector circuit that detects the temperature at a fixed site in the transistor power amplifier are present concurrently. Thus, even when the load resistance value decreases below a set value, the power supply voltage does not change when the temperature of the fixed site of the amplifier does not exceed a set value. Consequently, the output is not limited when the amplified signals have a small time ratio for large outputs and the mean loss of the power transistor is small.

What is claimed is:

1. Power limiting circuitry for use with a power amplifier, said power amplifier having (a) a power supply voltage source connected thereto and (b) a load impedance, said power limiting circuitry comprising
detecting means for detecting the magnitude of said load impedance and
control switching means responsive to said detecting means for controlling the magnitude of the power supply voltage applied to said power amplifier so as to maintain the output of said power amplifier within substantially the same range for different values of said magnitude of the load impedance.

2. Circuitry as in claim 1 including
means for sensing the temperature at a predetermined point in said power amplifier and generating an output signal when the temperature exceeds a predetermined amount; and
AND circuit means responsive to said detecting means and said temperature sensing means for actuating said control means in response thereto.

3. Circuitry as in claim 2 where said power amplifier includes at least one power transistor for regulating the current supplied to said load impedance and, said predetermined point being in the vicinity of said power transistor.

4. Circuitry as in claim 1 where said detecting means comprises bridge circuit means having said load impedance in one arm thereof where said bridge circuit is balanced for a predetermined value of said load impedance.

5. Circuitry as in claim 4 where said power amplifier includes (a) at least one power transistor for regulating the current supplied to said load impedance and (b) an emitter impedance connected between the emitter of said power transistor and said load impedance, said emitter impedance and said load impedance comprising one ratio arm of said bridge circuit and where said bridge circuit further includes a pair of series connected impedances which comprise the other ratio arm thereof.

6. Circuitry as in claim 5 where said bridge circuit includes a transistor having its base and emitter connected between (a) the junction between the emitter impedance of the power transistor and the load impedance and (b) the junction between said pair of series connected impedances.

7. Circuitry as in claim 5 where said load impedance comprises a speaker coil and said bridge circuit includes a capacitor connected across said pair of series connected impedances to compensate for phase differences between the voltage across and the current through said speaker coil.

8. Circuitry as in claim 1 where
said power supply voltage source includes (a) a transformer connected to an alternating current source, the secondary winding of said transformer having at least a first and second pair of taps and (b) a rectifying circuit connected to said power amplifier and
said control switching means is responsive to said detecting means to connect either said first pair of taps or said second pair of taps to said rectifying circuit to thereby maintain the maximum power output from said power amplifier within a fixed range.

9. Circuitry as in claim 1 where
said power supply voltage source includes (a) a transformer connected to an alternating current source, the secondary winding of said transformer having at least a first and second pair of taps and (b) a pair of rectifying circuits respectively connected to said pair of taps, both of said rectifying circuits being selectively connected to said power amplifier and
said control switching means is responsive to said detecting means to connect either said first rectifying circuit or said second rectifying circuit to said power amplifier to thereby maintain the maximum power output from said power amplifier within a fixed range.

10. Circuitry as in claim 1 where
said power supply voltage source includes (a) an alternating current source and (b) a rectifying circuit responsive to said alternating current source and connected to said power amplifier, said rectifying circuit including at least one silicon-controlled rectifier and
said control switching means is responsive to said detecting means to control the firing angle of said silicon-controlling rectifier to thereby maintain the maximum power output from said power amplifier within a fixed range.

11. Circuitry as in claim 1 where
said power supply voltage source includes (a) an alternating current source and (b) a diode rectifying circuit responsive to said alternating current source and connected to said power amplifier and
said control switching means is responsive to said detecting means to regulate the portion of each positive and negative cycle of the alternating current applied to said diode rectifying circuit to thereby maintain the maximum power output from said power amplifier within a fixed range.

12. Circuitry as in claim 1 where
said power supply voltage source includes (a) an alternating current source and (b) a diode rectifying circuit responsive to said alternating current source and connected to said power amplifier and
said control switching means is responsive to said detecting means to regulate the portion of each cycle of the output from said diode rectifying circuit applied to said power amplifier to thereby maintain the maximum power output from said power amplifier within a fixed range.

* * * * *